United States Patent
Wang et al.

(10) Patent No.: US 9,620,485 B2
(45) Date of Patent: Apr. 11, 2017

(54) LIGHT EMITTING DEVICE

(71) Applicant: BOE TECHNOLOGY GROUP CO., LTD., Beijing (CN)

(72) Inventors: Shang Wang, Beijing (CN); Qiuxiang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/436,064

(22) PCT Filed: Jul. 7, 2014

(86) PCT No.: PCT/CN2014/081735
§ 371 (c)(1),
(2) Date: Apr. 15, 2015

(87) PCT Pub. No.: WO2015/139387
PCT Pub. Date: Sep. 24, 2015

(65) Prior Publication Data
US 2016/0379964 A1    Dec. 29, 2016

(30) Foreign Application Priority Data
Mar. 21, 2014    (CN) .......................... 2014 1 0106498

(51) Int. Cl.
*H01L 33/00* (2010.01)
*H01L 25/075* (2006.01)
(Continued)

(52) U.S. Cl.
CPC ............ *H01L 25/0753* (2013.01); *F21K 9/00* (2013.01); *F21K 9/60* (2016.08); *H01L 27/3211* (2013.01);
(Continued)

(58) Field of Classification Search
CPC ........................... H01L 25/0753; H01L 33/60
(Continued)

(56) References Cited

U.S. PATENT DOCUMENTS 7,261,454 B2    8/2007    Ng
7,594,839 B2    9/2009    Cok et al.
(Continued)

FOREIGN PATENT DOCUMENTS

CN    1542516    11/2004
CN    1542516 A    11/2004
(Continued)

OTHER PUBLICATIONS

Chinese Office Action with English Language Translation, dated Feb. 2, 2016, Chinese Application No. 201410106498.X.
(Continued)

*Primary Examiner* — Long K Tran
(74) *Attorney, Agent, or Firm* — Blakely Sokoloff Taylor & Zafman LLP

(57) ABSTRACT

Embodiments of the invention provides a light emitting device, which comprises a backplane, an encapsulating structure, and a light emitting structure and a scattering layer disposed between the backplane and the encapsulating structure; the scattering layer is located on the light exiting side of the light emitting structure; the light emitting structure is isolated into a plurality of light emitting units, the scattering layer is isolated into a plurality of scattering units, and the plurality of light emitting units correspond to the plurality of scattering units one to one; wherein each of the light emitting units comprises a first light emitting sub-unit, a second light emitting sub-unit and a third light emitting sub-unit. The embodiments of the invention may be used for
(Continued)

a display device and a lighting lamp, thereby increasing the light emitting area and achieving uniform mixed emergent light.

14 Claims, 3 Drawing Sheets

(51) Int. Cl.
  *H01L 33/60* (2010.01)
  *F21K 9/00* (2016.01)
  *H01L 33/56* (2010.01)
  *F21K 9/60* (2016.01)
  *H01L 27/32* (2006.01)
  *H01L 51/52* (2006.01)
  *F21Y 101/00* (2016.01)
  *F21Y 113/13* (2016.01)
  *F21Y 115/10* (2016.01)
  *F21Y 115/15* (2016.01)

(52) U.S. Cl.
  CPC .............. *H01L 33/56* (2013.01); *H01L 33/60* (2013.01); *H01L 51/5253* (2013.01); *H01L 51/5268* (2013.01); *H01L 51/5271* (2013.01); *F21Y 2101/00* (2013.01); *F21Y 2113/13* (2016.08); *F21Y 2115/10* (2016.08); *F21Y 2115/15* (2016.08); *H01L 2924/0002* (2013.01); *H01L 2933/0091* (2013.01)

(58) Field of Classification Search
  USPC ......................................................... 257/89
  See application file for complete search history.

(56) References Cited

U.S. PATENT DOCUMENTS

| 2002/0006040 | A1 | 1/2002 | Kamada et al. |
| 2002/0097578 | A1* | 7/2002 | Greiner ............... G02B 6/0021 362/240 |
| 2007/0200496 | A1 | 8/2007 | Cok et al. |
| 2010/0106147 | A1* | 4/2010 | Boitor ................... A61B 18/22 606/16 |
| 2013/0256711 | A1 | 10/2013 | Joo et al. |

FOREIGN PATENT DOCUMENTS

| CN | 1831616 | 9/2006 |
| CN | 101173739 | 5/2008 |
| CN | 101173739 A | 5/2008 |
| CN | 101211054 | 7/2008 |
| CN | 102024804 A | 4/2011 |
| CN | 102468395 A | 5/2012 |

OTHER PUBLICATIONS

Chinese Office Action with English Language Translation, dated Feb. 2, 2016, Chinese Application No. 201410106198.X.
Office Action in Chinese Application No. 201410106498.X dated Jul. 6, 2016, with English translation.
Office Action in Chinese Application No. 201410106498.X dated Dec. 12, 2016, with English translation. 11 pages.

* cited by examiner

LIGHT EMITTING DEVICE

FIELD OF THE INVENTION

The invention relates to the field of display and lighting technologies, and in particular, to a light emitting device.

BACKGROUND OF THE INVENTION

In the prior art, as shown in FIG. 1, an LED (Light Emitting Diode) display panel or an OLED (Organic Light Emitting Diode) display panel consists mainly of a backplane 10, an encapsulating structure 40 and a light emitting structure 20 located between the backplane 10 and the encapsulating structure 40; wherein individual light emitting units of the light emitting structure 20 employ a tiling mode, namely, a first light emitting sub-unit 201, a second light emitting sub-unit 202 and a third light emitting sub-unit 203 are arranged alternately on the backplane 10 in the form of a plane. Since each light emitting sub-unit comprises a primary light emitting region and dark regions located on both sides of the primary light emitting region, a dark region adjoining portion between two adjacent sub-pixel units emits light relatively weakly, and thereby a picture division may be formed, such that the light emitting does not cover the entire display panel. In addition, since each pixel unit comprises three, e.g., red, green and blue, sub-pixel units, and the light emanated by a light emitting sub-unit corresponding to each sub-pixel unit employs a way of exiting respectively when exiting from the display panel, this will result in that colors of different sub-pixels are mutually separated.

SUMMARY OF THE INVENTION

An embodiment of the invention provides a light emitting device which may increase the light emitting area and achieve uniform mixed emergent light.

To achieve the above objective, an embodiment of the invention employs the following technical solution.

A light emitting device is provided, which comprises a backplane, an encapsulating structure, and a light emitting structure and a scattering layer disposed between the backplane and the encapsulating structure; the scattering layer is located on the light exiting side of the light emitting structure; the light emitting structure is isolated into a plurality of light emitting units, the scattering layer is isolated into a plurality of scattering units, and the plurality of light emitting units correspond to the plurality of scattering units one to one; wherein each of the light emitting units comprises a first light emitting sub-unit, a second light emitting sub-unit and a third light emitting sub-unit.

By disposing the scattering layer on the light exiting side of the light emitting structure and making the light emitting units correspond to the scattering units one to one, the light emanated from individual light emitting sub-units in each of the light emitting unit may be enabled to undergo the light scattering effect of the scattering units before exiting, thereby achieving sufficient mixing. Thus, not only the phenomenon of the luminance of the primary light emitting region and the dark regions in one and the same light emitting unit being non-uniform may be improved, thereby increasing the light emitting area of the light emitting device; but mutual mixing of the light between different light emitting sub-units may also be realized, thereby eliminating a mutual separation of the colors of different light emitting sub-units and achieving uniform mixed emergent light.

Optionally, the backplane comprises a backplane base-plate and a plurality of sidewalls, and between two adjacent sidewalls are defined a light emitting unit and a scattering unit; for any of the light emitting units, the lower surface of the backplane base-plate is a plane; and the upper surface of the backplane base-plate comprises a first area for disposing the first light emitting sub-unit, a second area for disposing the second light emitting sub-unit and a third area for disposing the third light emitting sub-unit; wherein the second area is parallel to the lower surface of the backplane base-plate, and the first area and the third area are located on both sides of the second area, respectively; and there are obtuse angles between the first area and the second area and between the third area and the second area.

Further optionally, the angle between the first area and the second area is equal to the angle between the third area and the second area, and the range of the angles is between 120°~160°.

Optionally, the backplane is a flat plate structure; and the light emitting device further comprises a plurality of reflective plates disposed between the backplane and the encapsulating structure, and between two adjacent reflective plates are defined a light emitting unit and a scattering unit.

Further optionally, the section shape of the reflective plate is a rectangle or an isosceles triangle.

Further, the encapsulating structure comprises an encapsulating substrate; wherein the encapsulating substrate comprises scattering encapsulation glass.

Optionally, the first light emitting sub-unit, the second light emitting sub-unit and the third light emitting sub-unit comprise a red LED chip, a green LED chip and a blue LED chip, respectively.

Or, optionally, the first light emitting sub-unit, the second light emitting sub-unit and the third light emitting sub-unit comprise a red electroluminescent element, a green electroluminescent element and a blue electroluminescent element, respectively.

Optionally, the backplane is a flat plate structure; and individual light emitting sub-units are LED chips, the light emitting device further comprises a plurality of LED stands disposed between the backplane and the light emitting structure, and the plurality of LED stands correspond to the plurality of light emitting units one to one; wherein the LED stand comprises an integrally molded stand base and a supporting wall located on a side of the stand base; and the light emitting unit is disposed on the stand base, and the scattering unit is disposed over the light emitting unit and located between the supporting walls.

Further optionally, for any of the light emitting units, the lower surface of the stand base is a plane; and the upper surface of the stand base comprises a first section for disposing the first light emitting sub-unit, a second section for disposing the second light emitting sub-unit and a third section for disposing the third light emitting sub-unit; wherein the second section is parallel to the lower surface of the stand base, and the first section and the third section are located on both sides of the second section, respectively; and there are obtuse angles between the first section and the second section and between the third section and the second section.

Further, the angle between the first section and the second section is equal to the angle between the third section and the second section, and the range of the angles is between 120°~160°.

Optionally, for any of the light emitting units, the stand base is a flat plate structure.

Further optionally, the encapsulating structure comprises reflective sheets in contact with the LED stands, an encapsulating lens array located over the reflective sheets and in contact with the reflective sheets, and encapsulating silicone filled between the reflective sheets, the encapsulating lens array and the scattering layer; wherein the contact area of the encapsulating silicone and the scattering layer is less than that of the encapsulating silicone and the encapsulating lens array.

Optionally, the scattering layer comprises transparent silicone and scattering particles distributed inside the transparent silicone; wherein the scattering particles comprise quartz crystal debris or glass debris.

BRIEF DESCRIPTION OF THE DRAWINGS

In order to more clearly illustrate the technical solutions in embodiments of the invention or in the prior art, the appended drawings needed to be used in the description of the embodiments or the prior art will be introduced briefly in the following. Obviously, the drawings in the following description are only some embodiments of the invention, and for those of ordinary skills in the art, other drawings may be obtained according to these drawings under the premise of not paying out creative work.

REFERENCE NUMERALS

Figure 1:
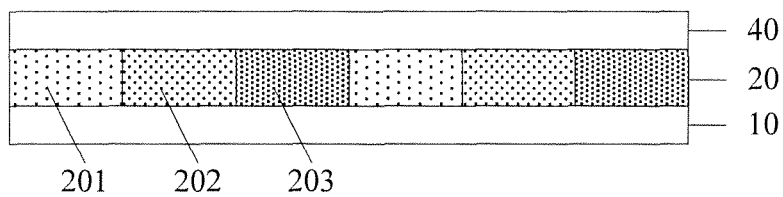
FIG. 1 is a structural schematic diagram of an LED/OLED display panel in the prior art.

10 Backplane
101 Backplane base-plate
102 Sidewall
20 Light emitting structure
201 First light emitting sub-unit
202 Second light emitting sub-unit
203 Third light emitting sub-unit
30 Scattering layer
301 Transparent silicone
302 Scattering particle
40 Encapsulating structure
400 Scattering encapsulation glass
401 Encapsulating silicone
402 Reflective sheet
403 Encapsulating lens array
50 Reflective plate
60 LED stand
601 Stand base
602 Supporting wall
70 Supporting frame

DETAILED DESCRIPTION OF THE INVENTION

In the following the technical solutions in embodiments of the invention will be described clearly and completely in connection with the drawings in the embodiments of the invention. Obviously, the described embodiments are just a part of the embodiments of the invention, and not all the embodiments. Based on the embodiments in the invention, all the other embodiments obtained by those of ordinary skills in the art under the premise of not paying out creative work pertain to the scope protected by the invention.

Figure 2:
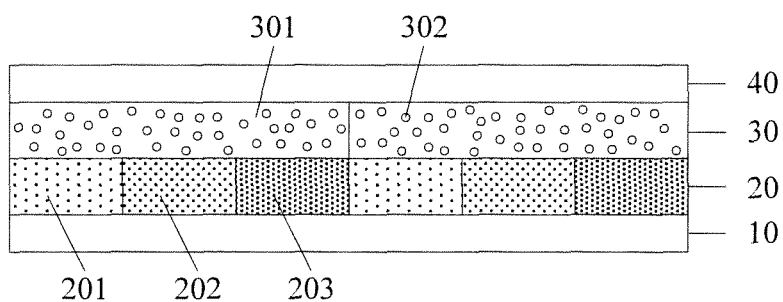
FIG. 2 is a structural schematic diagram of a light emitting device provided by an embodiment of the invention.

An embodiment of the invention provides a light emitting device, as shown in FIG. 2, and the light emitting device comprises a backplane 10, an encapsulating structure 40, and a light emitting structure 20 and a scattering layer 30 disposed between the backplane 10 and the encapsulating structure 40; the scattering layer 30 is located on the light exiting side of the light emitting structure 20; the light emitting structure 20 is isolated into a plurality of light emitting units, the scattering layer 30 is isolated into a plurality of scattering units, and the plurality of light emitting units correspond to the plurality of scattering units one to one; wherein each of the light emitting units comprises a first light emitting sub-unit 201, a second light emitting sub-unit 202 and a third light emitting sub-unit 203.

Optionally, the backplane 10 may be used for providing support and circuit support for the light emitting structure 20. Therein, the light emitting structure 20 may be directly disposed on the backplane 10; or also other supporting component may be disposed between the backplane 10 and the light emitting structure 20, and the light emitting structure 20 is disposed on the other supporting component.

When the light emitting structure 20 is directly disposed on the backplane 10, the backplane 10 may further comprise a thin film transistor and a circuit structure for controlling individual light emitting units. Therein, in the case of the light emitting unit comprising an LED chip, an electrode of the LED chip may be connected with the circuit structure on the backplane 10 via a gold line as a lead; or a flip LED chip is directly employed to be directly connected by soldering to a pad disposed on the backplane 10.

For the backplane 10, one of a metal substrate, a ceramic substrate, a glass substrate and a flexible base substrate may be selected and used; and for different purposes, the material of the backplane 10 may be different. Based on this, it will be clear to the skilled in the art that when the backplane 10 employs a metal substrate and the light emitting structure 20 is directly disposed on the backplane 10, an insulating layer should be further comprised between the light emitting structure 20 and the backplane 10.

The backplane 10 may be of a flat plate shape or other complex shape, and the encapsulating structure 40 may be an encapsulating substrate or other complex encapsulating structure; and here, the backplane 10 and the encapsulating structure 40 will not be particularly defined, and they may be designed according to the actual structure of the light emitting device.

The scattering layer 30 is used for scattering light emanated from the light emitting structure 20 to achieve uniform emergent light; and therefore, scattering particles with the function of scattering may be comprised inside the scattering layer 30.

The scattering layer 30 is located on the light exiting side of the light emitting structure 20; and according to the specific type (emitting light on a single side or emitting light on double sides) of the light emitting device, the scattering layer 30 may be disposed on a single side or on double sides of the light emitting structure 20. In the embodiment of the invention, that the scattering layer 30 is disposed on a single side will be taken as an example for illustration.

The first light emitting sub-unit 201, the second light emitting sub-unit 202 and the third light emitting sub-unit 203 may respectively correspond to one of a red light emitting sub-unit, a green light emitting sub-unit and a blue light emitting sub-unit, and their specific correspondence relationship will not be defined here.

Although in the embodiments of the invention, each light emitting unit comprises three light emitting sub-units, it will be appreciated by the skilled in the art that each light emitting unit may further comprise more light emitting sub-units emitting light of different colors.

Based on this, by disposing the scattering layer 30 on the light exiting side of the light emitting structure 20 and making the light emitting units correspond to the scattering units one to one, the light emanated from individual light emitting sub-units in each of the light emitting unit may be enabled to undergo the light scattering effect of the scattering units before exiting, thereby achieving sufficient mixing. Thus, not only the phenomenon of the luminance of the primary light emitting region and the dark regions in one and the same light emitting unit being non-uniform may be improved, thereby increasing the light emitting area of the light emitting device; but mutual mixing of the light between different light emitting sub-units may also be realized, thereby eliminating a mutual separation of the colors of different light emitting sub-units and achieving uniform mixed emergent light.

On this basis, optionally, the scattering layer 30 may comprise transparent silicone 301 and scattering particles 302 distributed inside the transparent silicone 301; wherein the scattering particles 302 may comprise quartz crystal debris or glass debris.

It needs to be noted here that the scattering particles 302 are used for scattering light emanated from the light emitting structure 20 to realize uniform emergent light, and thus the size of the scattering particles 302 should meet the criterion of not affecting the viewing experience of a viewer.

The light emitting device provided by the embodiment of the invention may increase the light emitting area and realize uniform mixed emergent light; and on this basis, the light emitting device may comprise a display panel and a lighting lamp.

Figure 3:
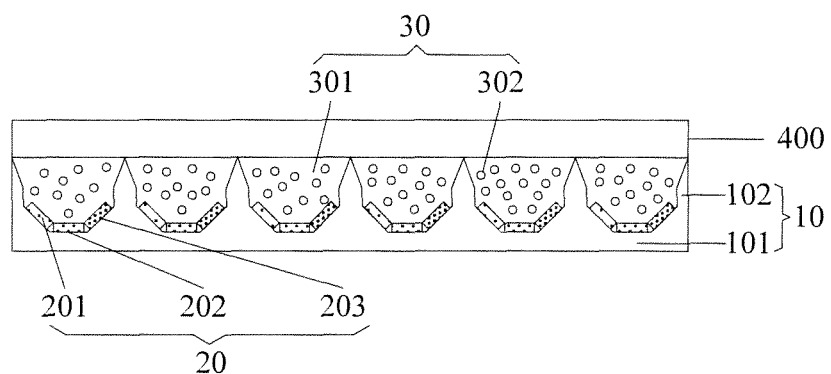
FIG. 3 is a structural schematic diagram of a display panel provided by an embodiment of the invention.

On one hand, when the light emitting device is a display panel, optionally, as shown in FIG. 3, the backplane 10 may comprise a backplane base-plate 101 and a plurality of sidewalls 102, and between two adjacent sidewalls 102 are defined a light emitting unit and a scattering unit.

For any of the light emitting units, the lower surface of the backplane base-plate 101 is a plane; and the upper surface of the backplane base-plate 101 comprises a first area for disposing the first light emitting sub-unit 201, a second area for disposing the second light emitting sub-unit 202 and a third area for disposing the third light emitting sub-unit 203; wherein the second area is parallel to the lower surface of the backplane base-plate 101, and the first area and the third area are located on both sides of the second area, respectively; and there are obtuse angles between the first area and the second area and between the third area and the second area.

In such a case, most of the light emanated from the first light emitting sub-unit 201, the second light emitting sub-unit 202 and the third light emitting sub-unit 203 will point to the intermediate area of the scattering unit, and sufficient mixing of the light may be achieved by the light scattering effect of the scattering unit, thereby improving the phenomenon of the luminance of the primary light emitting region and the dark regions in the light emitting unit being non-uniform, and greatly increasing the aperture ratio of the display panel. At the same time, the light emanated from the different light emitting sub-units is mixed together after scattering, thereby eliminating a mutual separation of the colors of the different light emitting sub-units and achieving uniform mixed emergent light.

Since the different light emitting sub-units are disposed in different areas of the backplane base-plate 101, and there is a certain angle between different areas of the backplane base-plate 101, there is also a certain angle between the first light emitting sub-unit 201, the second light emitting sub-unit 202 and the third light emitting sub-unit 203. On this basis, the angle between the first area and the second area is equal to the angle between the third area and the second area, and the range of the angles may be set between 120°~160°.

Thus, the first light emitting sub-unit 201 and the third light emitting sub-unit 203 may be located on both sides of the second light emitting sub-unit 202, respectively, and disposed obliquely; and on this basis, not only the light mixing effect between different sub-pixels (i.e., different light emitting sub-units) may be effectively improved, but the area of each pixel unit (i.e., each light emitting unit) may also be decreased, thereby improving the resolution of the display panel.

Based on the display panel with the structure described above, not only the aperture ratio of the display panel may be improved substantially to achieve uniform mixed emergent light, but the resolution of the display panel may also be increased.

Figure 4:
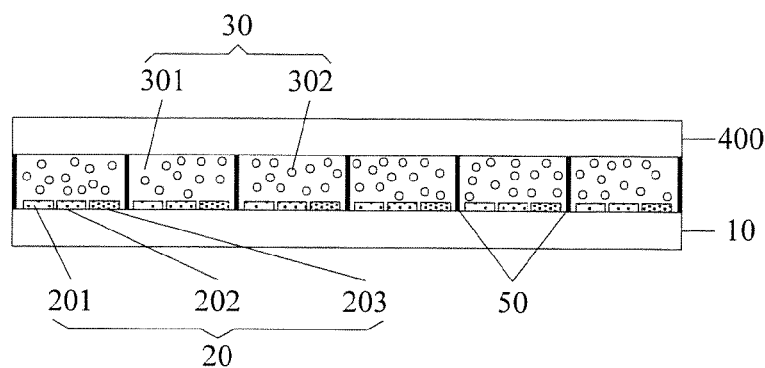
FIG. 4 is a structural schematic diagram of another display panel provided by an embodiment of the invention.
Figure 5:
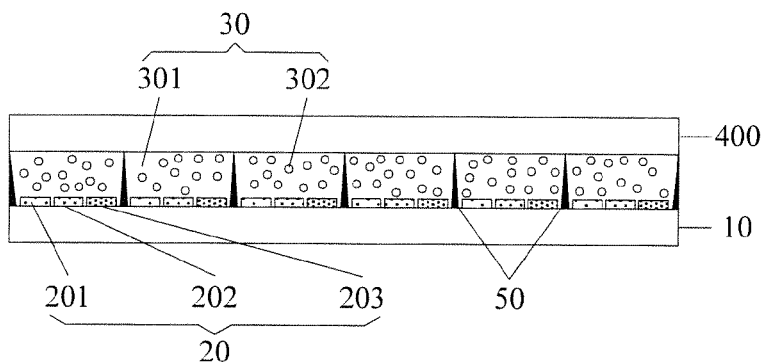
FIG. 5 is a structural schematic diagram of yet another display panel provided by an embodiment of the invention.

As shown in FIGS. 4 and 5, the backplane 10 of the light emitting device may be a flat plate structure, the light emitting device may further comprise a plurality of reflective plates 50 disposed between the backplane 10 and the encapsulating structure 40, and between two adjacent reflective plates 50 are defined a light emitting unit and a scattering unit.

Therein, the section shape of the reflective plate 50 may be a rectangle or an isosceles triangle.

Here, since the backplane 10 is a flat plate structure, when manufacturing the light emitting units, an existing process may be employed to tile light emitting units of different pixels directly on the backplane 10, thereby avoiding complication of the process. Further, by disposing the reflective plate 50 on the backplane 10, not only different pixel units may be isolated from each other, but the light undergoing the scattering effect and incident on the reflective plate 50 may also be re-reflected into the interior of the light emitting unit or exit directly.

In such a case, by the light scattering effect of the scattering unit on the light emanating from the first light emitting sub-unit 201, the second light emitting sub-unit 202 and the third light emitting sub-unit 203, light mixing may be achieved to a certain degree.

To obtain a better light mixing effect, the thickness of the scattering layer 30 may be increased so as to increase the light mixing distance; however, considering that the increase of the thickness of the scattering layer 30 may affect the utilization rate of the light energy to a certain extent, therefore, referring to FIG. 5, the section shape of the reflective plate 50 is preferably an isosceles triangle. As such, the sides of the reflective plate 50 are disposed obliquely, which may reflect light more effectively and thereby may increase the utilization rate of the light energy.

Based on the display panels with the two kinds of structures as describe above, whether by preparing the backplane 10 with a special structure, or by disposing the reflective plates 50 between the backplane 10 and the encapsulating structure 40, the light emanating from the first light emitting sub-unit 201, the second light emitting sub-unit 202 and the third light emitting sub-unit 203 may be caused to undergo the light scattering effect of the scattering layer 30 to achieve preliminary mixing. To attain a better light mixing effect, further, the encapsulating structure 40 may comprise an encapsulating substrate; wherein the encapsulating substrate is preferably scattering encapsulation glass 400.

It needs to be noted here that, the scattering encapsulation glass 400 is a kind of encapsulating glass with the function of scattering, whose material is similar to that of the scattering plate of the backlight module of a liquid crystal display. However, it may be appreciated by the skilled in the art that, under the premise of having the scattering layer 30, replacement of the scattering encapsulation glass 400 with encapsulating glass without the function of scattering is also feasible.

On this basis, that the light emanating from the first light emitting sub-unit 201, the second light emitting sub-unit 202 and the third light emitting sub-unit 203 undergoes the first scattering effect of the scattering layer 30 may implement preliminary light mixing, and when the light exits, it may also undergo the second scattering effect of the scattering encapsulation glass 400, thereby further improving the uniformity of light mixing.

Based on the above description, optionally, the first light emitting sub-unit 201, the second light emitting sub-unit 202 and the third light emitting sub-unit 203 may comprise a red LED chip, a green LED chip and a blue LED chip, respectively; and at this point, the display panel is an LED display panel.

Or, optionally, the first light emitting sub-unit 201, the second light emitting sub-unit 202 and the third light emitting sub-unit 203 may comprise a red electroluminescent element, a green electroluminescent element and a blue electroluminescent element, respectively; and at this point, the display panel is an OLED display panel.

Figure 6:
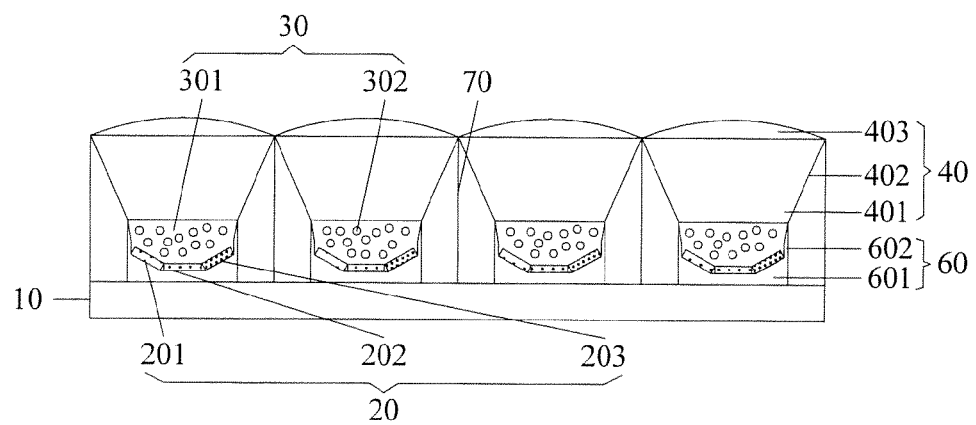
FIG. 6 is a structural schematic diagram of an LED lighting lamp provided by an embodiment of the invention.
Figure 7:
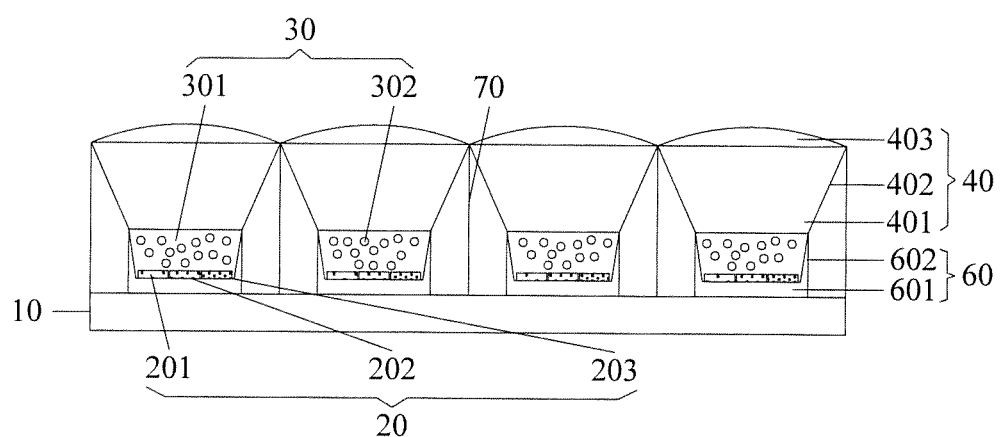
FIG. 7 is a structural schematic diagram of another LED lighting lamp provided by an embodiment of the invention.

On the other hand, when the light emitting device is a lighting lamp, optionally, as shown in FIGS. 6 and 7, the backplane 10 is a flat plate structure; and individual light emitting sub-units may be LED chips, the light emitting device further comprises a plurality of LED stands 60 disposed between the backplane 10 and the light emitting structure 20, and the plurality of LED stands 60 correspond to the plurality of light emitting units one to one; wherein the LED stand 60 comprises an integrally molded stand base 601 and a supporting wall 602 located on a side of the stand base 601; and the light emitting unit is disposed on the stand base 601, and the scattering unit is disposed over the light emitting unit and located between the supporting walls 602.

Here, the first light emitting sub-unit 201, the second light emitting sub-unit 202 and the third light emitting sub-unit 203 may comprise a red LED chip, a green LED chip and a blue LED chip, respectively. It may be appreciated by the skilled in the art that replacement of the LED chip in the embodiment of the invention with an OLED chip is also feasible.

When light passes the scattering layer 30 located over the light emitting structure 20, the light emanated from the different LED chips may undergo the scattering effect of the scattering particles 302 and be mixed with each other, so as to achieve homogenization of the light. In addition, it may also be that the luminous intensities of the individual LED chips are adjusted according to the actual needs, thereby achieving illumination of light of different colors; for example, the luminous intensities of the red LED chip, the green LED chip and the blue LED chip may be made to be equal by adjustment, and uniform mixing may be done by the scattering effect of the scattering layer 30, thereby achieving white light illumination.

To increase the divergence angle of a light beam and expand the lighting range, optionally, with reference to FIGS. 6 and 7, the encapsulating structure 40 may comprise reflective sheets 402 in contact with the LED stands 60, an encapsulating lens array 403 located over the reflective sheets 402 and in contact with the reflective sheets 402, and encapsulating silicone 401 filled between the reflective sheets 402, the encapsulating lens array 403 and the scattering layer 30.

Therein, the contact area of the encapsulating silicone 401 and the scattering layer 30 is less than that of the encapsulating silicone 401 and the encapsulating lens array 403.

Here, the reflective sheets 402 are in contact with the LED stand 60 and the encapsulating lens array 403, respectively, thereby forming a closed structure; and the encapsulating silicone 401 is sufficiently filled in the closed structure, and therefore, the shape of the encapsulating silicone 401 depends on the internal shape of the closed structure. Further, the reflective sheets 402 may further be flaring shaped by the fixation of a supporting frame 70 disposed on the backplane 10. It needs to be noted that, by the reflective sheets 402 being flaring shaped, it particularly means that the width of a tubular structure constituted by the reflective sheets 402 for filling the encapsulating silicone 401 increases gradually along the direction of emission of the mixed light.

On this basis, the encapsulating silicone 401 may employ highly transparent silicone, thereby avoiding the attenuation of the luminance due to an excessive thickness of the encapsulating structure 40; in addition, by disposing the reflective sheet 402, the light incident on the surface of the reflective sheet 402 may be reflected back to the interior of the encapsulating silicone 401, preventing the light from exiting from a side; and further, by disposing the encapsulating lens array 403, the divergence scope of the light may be effectively expanded, achieving uniform illumination of the light.

Based on the above description, optionally, with reference to FIG. 6, for any of the light emitting units, the lower surface of the stand base 601 is a plane; and the upper surface of the stand base 601 comprises a first section for disposing the first light emitting sub-unit 201, a second section for disposing the second light emitting sub-unit 202 and a third section for disposing the third light emitting sub-unit 203; wherein the second section is parallel to the lower surface of the stand base 601, and the first section and the third section are located on both sides of the second section, respectively; and there are obtuse angles between the first section and the second section and between the third section and the second section.

As such, the light emanated from different light emitting sub-units will point to the intermediate area of the scattering unit, and sufficient mixing of the light may be achieved by the light scattering effect of the scattering unit, thereby improving the phenomenon of the luminance of the primary light emitting region and the dark regions in the light emitting unit being non-uniform, and increasing the light emitting area. At the same time, the light emanated from the different light emitting sub-units is mixed together after scattering, which results in mutual mixing of light of different colors, thereby eliminating a mutual separation of the light of different colors and achieving uniform mixed emergent light.

On this basis, further, the angle between the first section and the second section is equal to the angle between the third section and the second section, and the range of the angles is preferably between 120°~160°.

Certainly, the shape of the LED stand 60 is not limited the above-mentioned structure. Optionally, with reference to FIG. 7, for any of the light emitting units, the stand base 601 may further be a flat plate structure, which facilitates the disposition of the LED chips.

What has been described above is just specific embodiments of the invention, however, the protection scope of the invention is not limited thereto, and variations or alternatives easily occurring to any artisan familiar with the technical field within the technical scope disclosed by the invention should be encompassed within the protection scope of the invention. Therefore, the protection scope of the invention should be subject to the protection scope of the claims.

The invention claimed is:

1. A light emitting device comprising:
    a backplane, an encapsulating structure, and
    a light emitting structure and a scattering layer disposed between the backplane and the encapsulating structure;
        wherein the scattering layer is located on the light exiting side of the light emitting structure;
        wherein the light emitting structure is isolated into a plurality of light emitting units, the scattering layer is isolated into a plurality of scattering units, and each one of the plurality of scattering units covers one light emitting unit completely; and
        wherein each of the light emitting units comprises a first light emitting sub-unit, a second light emitting sub-unit and a third light emitting sub-unit.

2. The light emitting device as claimed in claim 1, wherein the backplane comprises a backplane base-plate and a plurality of sidewalls, and between two adjacent sidewalls are defined a light emitting unit and a scattering unit;
    for any of the light emitting units, the lower surface of the backplane base-plate is a plane; and the upper surface of the backplane base-plate comprises a first area for disposing the first light emitting sub-unit, a second area for disposing the second light emitting sub-unit and a third area for disposing the third light emitting sub-unit;
    wherein the second area is parallel to the lower surface of the backplane base-plate, and the first area and the third area are located on both sides of the second area, respectively; and
    there are obtuse angles between the first area and the second area and between the third area and the second area.

3. The light emitting device as claimed in claim 2, wherein the angle between the first area and the second area is equal to the angle between the third area and the second area, and the range of the angles is between 120°~160°.

4. The light emitting device as claimed in claim 1, wherein the backplane is a flat plate structure; and
    the light emitting device further comprises a plurality of reflective plates disposed between the backplane and the encapsulating structure, and between two adjacent reflective plates are defined a light emitting unit and a scattering unit.

5. The light emitting device as claimed in claim 4, wherein the section shape of the reflective plate is a rectangle or an isosceles triangle.

6. The light emitting device as claimed in claim 1, wherein the encapsulating structure comprises an encapsulating substrate;
    wherein the encapsulating substrate comprises scattering encapsulation glass.

7. The light emitting device as claimed in claim 1, wherein the first light emitting sub-unit, the second light emitting sub-unit and the third light emitting sub-unit comprise a red LED chip, a green LED chip and a blue LED chip, respectively.

8. The light emitting device as claimed in claim 1, wherein the first light emitting sub-unit, the second light emitting sub-unit and the third light emitting sub-unit comprise a red electroluminescent element, a green electroluminescent element and a blue electroluminescent element, respectively.

9. The light emitting device as claimed in claim 1, wherein the backplane is a flat plate structure; and
    individual light emitting sub-units are LED chips, the light emitting device further comprises a plurality of LED stands disposed between the backplane and the light emitting structure, and the plurality of LED stands correspond to the plurality of light emitting units one to one;
    wherein the LED stand comprises an integrally molded stand base and a supporting wall located on a side of the stand base; and
    the light emitting unit is disposed on the stand base, and the scattering unit is disposed over the light emitting unit and located between the supporting walls.

10. The light emitting device as claimed in claim 9, wherein for any of the light emitting units, the lower surface of the stand base is a plane; and
    the upper surface of the stand base comprises a first section for disposing the first light emitting sub-unit, a second section for disposing the second light emitting sub-unit and a third section for disposing the third light emitting sub-unit;
    wherein the second section is parallel to the lower surface of the stand base, and the first section and the third section are located on both sides of the second section, respectively; and
    there are obtuse angles between the first section and the second section and between the third section and the second section.

11. The light emitting device as claimed in claim 10, wherein the angle between the first section and the second section is equal to the angle between the third section and the second section, and the range of the angles is between 120°~160°.

12. The light emitting device as claimed in claim 9, wherein for any of the light emitting units, the stand base is a flat plate structure.

13. The light emitting device as claimed in claim 9, wherein the encapsulating structure comprises reflective sheets in contact with the LED stands, an encapsulating lens array located over the reflective sheets and in contact with the reflective sheets, and encapsulating silicone filled between the reflective sheets, the encapsulating lens array and the scattering layer;
    wherein the contact area of the encapsulating silicone and the scattering layer is less than that of the encapsulating silicone and the encapsulating lens array.

14. The light emitting device, as claimed in claim 1, wherein the scattering layer comprises transparent silicone and scattering particles distributed inside the transparent silicone;
    wherein the scattering particles comprise quartz crystal debris or glass debris.

* * * * *